United States Patent
Hessler et al.

(10) Patent No.: US 9,071,223 B2
(45) Date of Patent: Jun. 30, 2015

(54) AT LEAST FIRST AND SECOND ORDER TEMPERATURE-COMPENSATED RESONATOR

(75) Inventors: Thierry Hessler, St-Aubin (CH); Thierry Conus, Lengnau (CH); Kaspar Truempy, Soleure (CH)

(73) Assignee: The Swatch Group Research and Development Ltd., Marin (CH)

( * ) Notice: Subject to any disclaimer, the term of this patent is extended or adjusted under 35 U.S.C. 154(b) by 549 days.

(21) Appl. No.: 13/510,181

(22) PCT Filed: Nov. 10, 2010

(86) PCT No.: PCT/EP2010/067181
§ 371 (c)(1),
(2), (4) Date: May 16, 2012

(87) PCT Pub. No.: WO2011/072960
PCT Pub. Date: Jun. 23, 2011

(65) Prior Publication Data
US 2012/0230159 A1    Sep. 13, 2012

(51) Int. Cl.
| | |
|---|---|
| *H01L 41/08* | (2006.01) |
| *H03H 9/02* | (2006.01) |
| *G04B 17/22* | (2006.01) |
| *H01L 41/22* | (2013.01) |
| *H03H 3/007* | (2006.01) |

(52) U.S. Cl.
CPC ............ *H03H 9/02448* (2013.01); *H01L 41/22* (2013.01); *G04B 17/227* (2013.01); *H03H 3/0076* (2013.01)

(58) Field of Classification Search
USPC .......... 368/159–160, 175; 310/300, 311, 346, 310/370
See application file for complete search history.

(56) References Cited

U.S. PATENT DOCUMENTS 7,170,218 B2 * 1/2007 Kawashima .................. 310/370
7,344,302 B2 * 3/2008 Musy et al. .................. 368/175
(Continued)

FOREIGN PATENT DOCUMENTS

| EP | 1 422 436 | 5/2004 |
|---|---|---|
| WO | 2007 072409 | 6/2007 |
| WO | 2008 043727 | 4/2008 |

OTHER PUBLICATIONS

Nakagawa, Y., "Control of Second Order Temperature Coefficient of Saw Propagating in Two Thin Film Layers," Ultrasonics Symposium 1993, IEEE 1993, pp. 287-290, (Oct. 31, 1993).

(Continued)

*Primary Examiner* — Sean Kayes
(74) *Attorney, Agent, or Firm* — Oblon, McClelland, Maier & Neustadt, L.L.P.

(57) ABSTRACT

A temperature compensated resonator including a body used in deformation, the core of the body including a first material. The body includes at least a first and second coating allowing the resonator to have substantially zero first and second order temperature coefficients. The temperature compensated regulator can be used in the field of time and frequency bases.

16 Claims, 3 Drawing Sheets

(56) References Cited

U.S. PATENT DOCUMENTS

| | | | |
|---|---|---|---|
| 7,682,068 B2* | 3/2010 | Bourgeois | 368/169 |
| 2005/0195050 A1 | 9/2005 | Lutz et al. | |
| 2005/0281137 A1 | 12/2005 | Bourgeois et al. | |
| 2006/0033594 A1 | 2/2006 | Lutz et al. | |
| 2008/0204173 A1* | 8/2008 | Melamud et al. | 333/234 |
| 2009/0121808 A1 | 5/2009 | Van Beek et al. | |
| 2009/0219104 A1 | 9/2009 | Van Beek et al. | |
| 2010/0013360 A1 | 1/2010 | Baborowski et al. | |

OTHER PUBLICATIONS

Schoen, F., et al., "Temperature Compensation in Silicon-Based Micro-Electromechanical Resonators," Micro Electro Mechanical Systems 2009, IEE $22^{nd}$ International Conference, pp. 884-887, (Jan. 25, 2009).

Melamud, R., et al., "Temperature-Insensitive Composite Micromechanical Resonators," Journal of Mricoelectromechanical Systems, vol. 18, No. 6, pp. 1409-1419, (Dec. 1, 2009).

Bhattacharjee, K., et al., "Temperature Compensation in SAW Filters by Tri-Layer Wafer Engineering," Frequency Control Symposium 2007, IEE PI, pp. 189-193, (May 1, 2007).

International Search Report Issued Apr. 18, 2011 in PCT/EP10/67181 Filed Nov. 10, 2010.

* cited by examiner

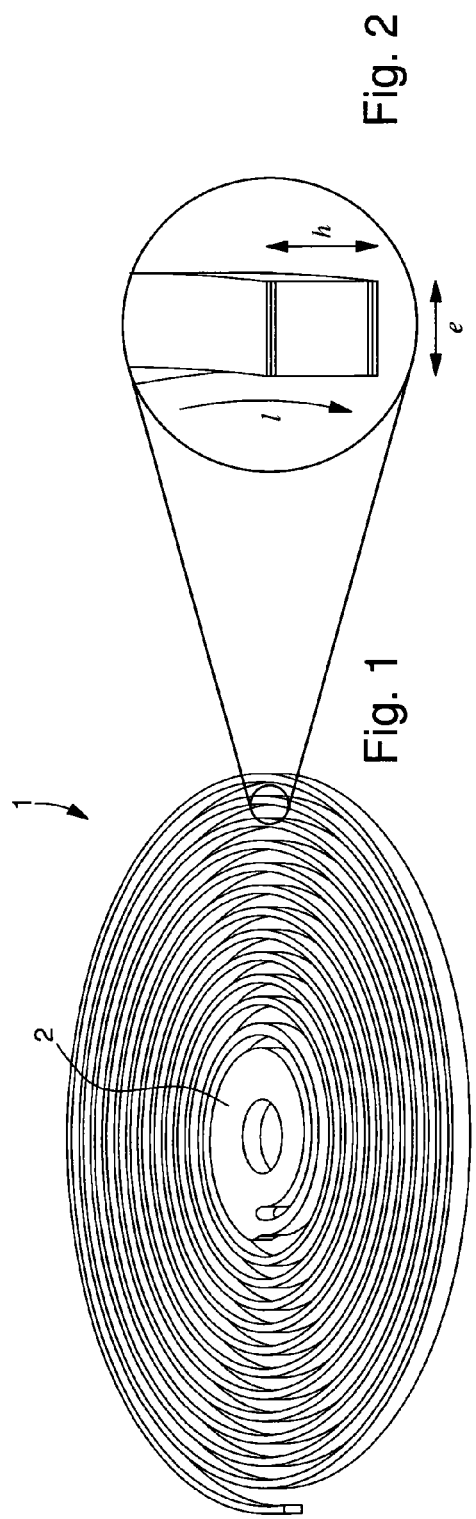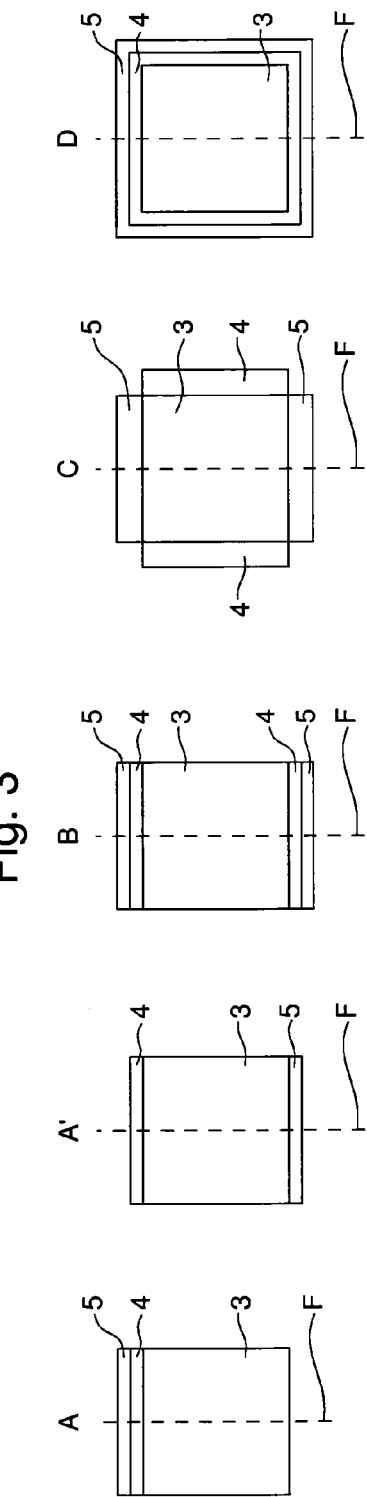

US 9,071,223 B2

AT LEAST FIRST AND SECOND ORDER TEMPERATURE-COMPENSATED RESONATOR

This is a National Phase Application in the United States of International Patent Application PCT/EP2010/067181 filed Nov. 10, 2010, which claims priority on European Patent Application No. 09179323.2 of Dec. 15, 2009. The entire disclosures of the above patent applications are hereby incorporated by reference.

FIELD OF THE INVENTION

The invention relates to a temperature-compensated resonator of the balance spring, MEMS or tuning fork type for manufacturing a time or frequency base whose temperature coefficients are substantially zero at least to the first and second order.

BACKGROUND OF THE INVENTION

EP Patent No. 1 422 436 discloses a balance spring formed of silicon and coated with silicon dioxide so as to make the temperature coefficient substantially zero around COSC (Swiss Official Chronometer Testing Institute) certification process temperatures, i.e. between +8 and +38° C. Likewise, WO Patent No. 2008-043727 discloses a MEMS resonator which has similar properties of low drift from its Young's modulus within the same temperature range.

However, even only the second order frequency drift in the above disclosures can require complex corrections depending upon the application. For example, for electronic watches to be able to be COSC certified, an electronic correction has to be carried out based on a temperature measurement.

SUMMARY OF THE INVENTION

It is an object of the present invention to overcome all or part of the aforementioned drawbacks, by providing an at least first and second order temperature-compensated resonator.

The invention therefore relates to a temperature-compensated resonator including a body used in deformation, the core of the body comprising a first material characterized in that the body includes at least a first and second coating respectively made of second and third materials, the variations of Young's modulus of each material with temperature being different, each thickness of said at least first and second coatings being adjusted to allow said resonator to have substantially zero first and second order frequency variations with temperature.

Advantageously according to the invention, the resonator body used in deformation has as many coatings as there are orders of temperature coefficient to compensate. Thus, depending upon the sizes and signs of each order of the materials of the core and of each coating, each thickness is calculated so as to compensate for each order.

In accordance with other advantageous features of the invention:
- the body includes a third coating made of a fourth material whose variations of Young's modulus with temperature are different from the materials of the core and the other coatings, each thickness of said three coatings being adjusted to allow said resonator to have substantially zero first, second and third order frequency variations with temperature;
- the core body has first and second order variations of Young's modulus with temperature which are negative, like single crystal silicon;
- the body includes a substantially quadrilateral-shaped section whose faces are in identical pairs or whose faces are entirely coated;
- the first coating has positive first order and negative second order variations of Young's modulus with temperature, such as silicon dioxide;
- the second coating has positive second order and positive first order variations of Young's modulus with temperature such as germanium dioxide or has a negative first order variation of Young's modulus with temperature;
- the first coating is inverted with the second coating;
- the deposition of said coatings is prioritized on the surfaces parallel to the neutral plane of the body so as to modify the frequency of said resonator with as much intensity as possible;
- the body is a bar rolled onto itself to form a balance spring and is coupled to an inertia fly wheel or includes at least two symmetrically mounted bars so as to form a tuning fork, or it is a MEMS resonator.

Finally, the invention also relates to a time or frequency base, such as, for example a timepiece, characterized in that it includes at least one resonator according to any of the preceding variants.

BRIEF DESCRIPTION OF THE DRAWINGS

Other features and advantages will appear clearly from the following description, given by way of non-limiting illustration, with reference to the annexed drawings, in which:
FIG. 1 is a general perspective diagram of a balance spring;
FIG. 2 is a representative section of the balance spring of FIG. 1;
FIG. 3 is a diagram of several embodiments according to the invention.

DETAILED DESCRIPTION OF PREFERRED EMBODIMENTS

As explained above, the invention relates to a resonator which may be a balance spring, tuning fork or more generally a MEMS ("micro electro mechanical system") resonator. To simplify explanation of the invention, the only application presented below is to a balance spring. However, those skilled in the art could, without any excessive difficulty, accomplish other resonator applications like those above from the teaching provided hereafter.

Likewise, the explanation refers to a core of the body, in our example a balance spring, formed from single crystal silicon. However, the material of the core is not limited to single crystal silicon but may be extended to different types of materials such as, for example, polysilicon, glass, nitride, diamond, single crystal quartz or metal.

Figure 6:
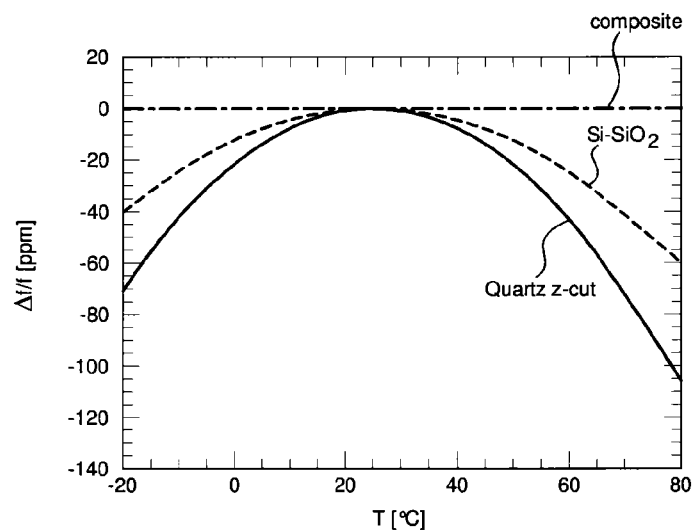
FIG. 6 is a graph showing the absence of frequency variation of a resonator according to the invention.

The graph of FIG. 6 shows the frequency drift characterisation for current resonators as a function of temperature. A first full line curve entitled "Quartz-z-cut" shows the frequency drift of a 32 kHz single crystal quartz tuning fork made in a slightly rotated z cut. A second short dashed line curve entitled "Si—SiO$_2$" shows the frequency drift of a silicon MEMS resonator coated with silicon dioxide.

For both these curves, it is seen that the drift is non-zero over a wide temperature range, particularly between −20 and +80° C. This frequency drift is mainly linked to the variation of Young's modulus with temperature. However, even the low frequency drift between +10 and +40° C. of the two current manufacturing examples may require extrinsic correction of the resonator. This is the case, for example, of an electronic watch which contains a quartz tuning fork electronically corrected on the basis of a temperature measurement of the watch, for COSC certification.

Thus, advantageously, it is an object of the invention to propose a resonator wherein the frequency drift with temperature is further minimised as shown by the dot and dash line curve entitled "composite", the scale of which is deliberately kept identical relative to the two other curves so as to show the significant difference in the drift. More specifically, the resonator body, according to the invention, includes as many coatings as there are temperature coefficients to compensate.

Preferably, the resonator body therefore includes at least two coatings and possibly a third coating if the second order compensation still causes an unacceptable frequency drift. However, after the third compensated order, the frequency drift becomes negligible for any resonator. Thus, depending upon the sizes and signs of each order of the materials of the core and each coating, each thickness is calculated so as to compensate for each order.

By way of definition, the relative frequency variation of a resonator obeys the following relationship:

$$\frac{\Delta f}{f_0} = A + \alpha \cdot (T - T_0) + \beta \cdot (T - T_0)^2 + \gamma \cdot (T - T_0)^3$$

where $$\frac{\Delta f}{f_0}$$

is the relative frequency variation, expressed in ppm ($10^{-6}$);
A is a constant which depends upon the point of reference, in ppm;
$T_0$ is the reference temperature, in ° C.;
$\alpha$ is the first order temperature coefficient, expressed in ppm. ° C.$^{-1}$;
$\beta$ is the second order temperature coefficient expressed in ppm. ° C.$^{-2}$;
$\gamma$ is the third order temperature coefficient, expressed in ppm. ° C.$^{-3}$.

Moreover, the thermoelastic coefficient (CTE) represents the relative variation of the Young's modulus with temperature. The terms "$\alpha$" and "$\beta$" which are used below thus respectively represent the first and second order temperature coefficients, i.e. the relative frequency variation of the resonator with temperature. The terms "$\alpha$" and "$\beta$" depend upon the thermoelastic coefficient of the resonator body and the expansion coefficients of the body. Moreover, the terms "$\alpha$" and "$\beta$" also take into account the coefficients peculiar to any separate inertia block, such as, for example, the balance for a sprung-balance resonator. Since the oscillations of any resonator intended for a time or frequency base have to be maintained, thermal dependence may also include a contribution from the maintenance system. Preferably, the resonator body is a core 3 coated with at least two coatings 4, 5.

The example illustrated in FIGS. 1 to 3 shows a balance spring 1 integral with the collet 2 wherein the first and second order temperature coefficients of the body are compensated. FIG. 2 proposes a cross-section of the balance spring body that shows more clearly the quadrilateral-shaped section thereof. The body can thus be defined by the length 1, height h and thickness e thereof. FIG. 3 shows possible but non-exhaustive alternatives A, A', B, C and D. Of course, coatings 4 and 5 are not to scale relative to the dimensions of core 3, in order to show more clearly the location of each part 3, 4 and 5.

In a first alternative A, a single surface of the section is successively coated with coating 4 and then coating 5. The order in which coatings 4 and 5 are applied is not set, i.e. coatings 4 and 5 may be inverted. Moreover, when it is the surfaces parallel to neutral plane F of the bar which are coated, this modifies the frequency of said resonator with more intensity than if the deposition is carried out on the surfaces perpendicular to bending plane F. Of course, it is also possible to envisage each coating 4, 5 being present on a different surface, as illustrated in alternative A'.

In a second alternative B or C, the section of the body includes pairs of identical surfaces. Thus, either two parallel surfaces include the two coatings 4, 5 applied in no particular order, i.e. coatings 4 and 5 may be inverted, as in example B, or each of the parallel surfaces has one of coatings 4, 5 as in example C. Of course, it is also possible to envisage coating 4 being present on two adjacent surfaces and the other two surfaces being coated with coating 5.

In a third alternative D, the section of the body includes surfaces which are entirely coated in succession with coating 4 and then coating 5. The order in which coatings 4 and 5 are applied is not, however, of any importance either, i.e. coatings 4 and 5 may be inverted.

Figure 4:
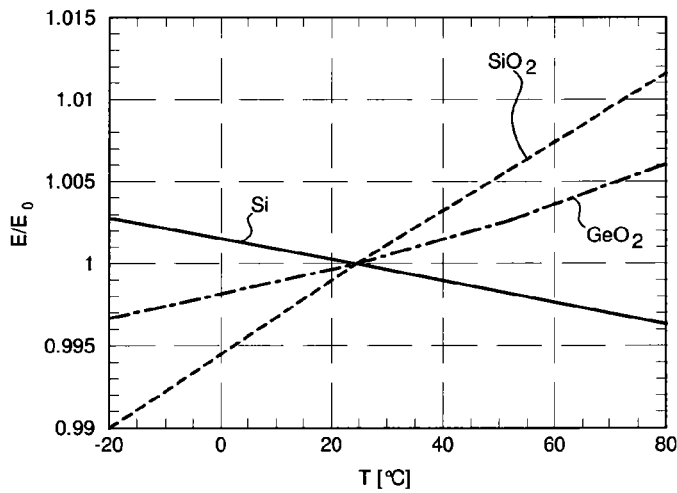
FIG. 4 is a graph showing the elastic modules of each material according to a first embodiment of the invention.

FIG. 4 shows a graph illustrating the temperature dependence of the Young's modulus of each material to illustrate an embodiment of the invention which uses silicon, silicon dioxide and germanium dioxide. Thus, the Young's modulus of silicon decreases by increasing the temperature when the Young's modulus of the other two materials increases by raising the temperature. Moreover, the increase is more marked for silicon dioxide than for germanium dioxide between the two temperature values, i.e. between −20° C. and +80° C.

In fact, the thermoelastic coefficient of silicon is negative to the first and second order when the coefficients of thermal elasticity of the other two materials are positive to the first order. However, the second order thermoelastic coefficient is negative for silicon dioxide whereas it is positive for germanium dioxide.

However, this interpretation of FIG. 4 focuses on the thermoelastic coefficient of the materials. Account must also be taken of the coefficients of expansion of the materials and the effect of the oscillation maintenance system to finally obtain the coefficients $\alpha$, $\beta$ of the resonator frequency modification. For comprehension of this final interpretation, the two coefficients thereof are shown in FIGS. 7 and 8.

Figure 7:
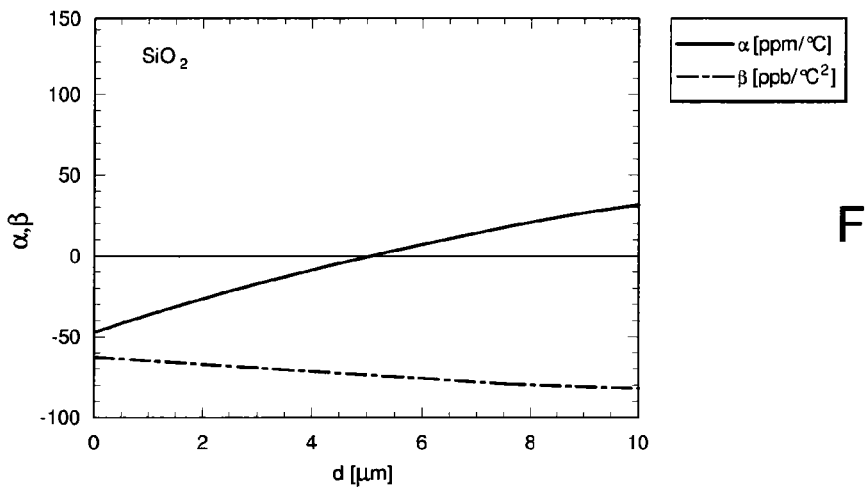
FIG. 7 is a graph showing the first and second order temperature coefficient variations of a silicon balance spring coated with silicon dioxide.

Thus, in FIG. 7, core 3 has negative first and second order coefficients of thermal elasticity, like silicon, and is coated with a coating 4 which includes positive first order and negative second order coefficients of thermal elasticity, such as silicon dioxide. The expansion coefficients of the materials, in particular that of the balance (18 ppm/° C.) are also taken into account. The effect of the oscillation maintenance system is negligible here. FIG. 7 also shows that the unity of the α orders (continuous lines) and β orders (discontinuous lines) is not the same. It can be seen that after a certain coating thickness, the first order α is compensated for, i.e. intersects line 0, however, the second order β simply decreases relative to the material of the core alone. It is thus clear that although the first order α can be compensated, this is not the case of the second order β.

Figure 8:
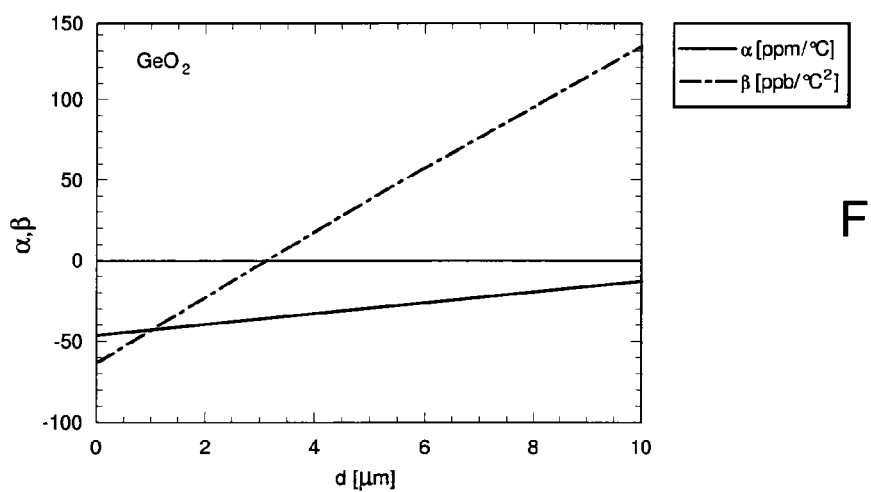
FIG. 8 is a graph showing the first and second order temperature coefficient variations of a silicon balance spring coated with germanium dioxide.

In FIG. 8, core 3 has negative first and second order coefficients of thermal elasticity, like silicon, coated with a coating 5 which has positive first and second order coefficients of thermal elasticity, such as germanium dioxide. As in FIG. 7, FIG. 8 shows that the unity of the α orders (continuous lines) and β orders (discontinuous lines) is not the same. It can be seen that from a thin coating thickness, the second order β is compensated for, i.e. intersects line 0, however, the first order α is compensated for at a greater thickness. However, it is impossible for both orders α and β to be compensated for with a thickness of a single material.

This is due to the differences in the sizes of the coefficients of thermal elasticity of each material at each order. Thus, although it may seem illusory to find a material for the coating that is the exact "reverse" of that of the core, which would allow for deposition of a single compensation layer, the invention proposes adding a coating for each order to be compensated. Each coating is not then intended to "directly" correct an order but to refine each of the compensations.

Figure 9:
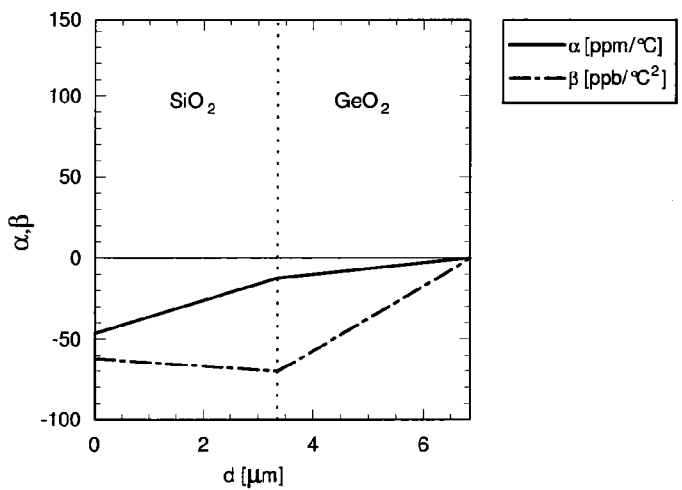
FIG. 9 is a graph showing the first and second order temperature coefficient variations of a silicon balance spring coated with silicon dioxide and germanium dioxide.

By way of example, calculations are shown in FIG. 9. In this example, core 3 has negative first and second order coefficients of thermal elasticity, like silicon. Core 3 is coated with a first coating 4 which has positive first order and negative second order coefficients of thermal elasticity, such as silicon dioxide. The first coating 4 is in turn coated by a second coating 5, which has positive first and second order coefficients of thermal elasticity, such as germanium dioxide.

FIG. 9 shows that it becomes possible, by calculation, to adjust each coating thickness 4, 5 so that the compensation of orders α and β converges on substantially the same final thickness, i.e. the two curves α and β intersect line 0 at the same thickness. In our example in FIG. 9, core 3, first coating 4 and second coating 5 thus have respective thicknesses of around 40, 3.5 and 3.6 microns.

Thus, depending upon the desired thickness of core 3 or that of the desired final section, it is possible to offer a resonator with greatly improved thermal compensation compared to that of the "Quartz-z-cut" or "Si—SiO$_2$," shown in FIG. 6.

Of course, this invention is not limited to the illustrated example but is capable of various variants and alterations that will appear to those skilled in the art. In particular, other materials may be envisaged for core 3 or for coatings 4, 5, etc. for obtaining improved thermal compensation.

Figure 5:
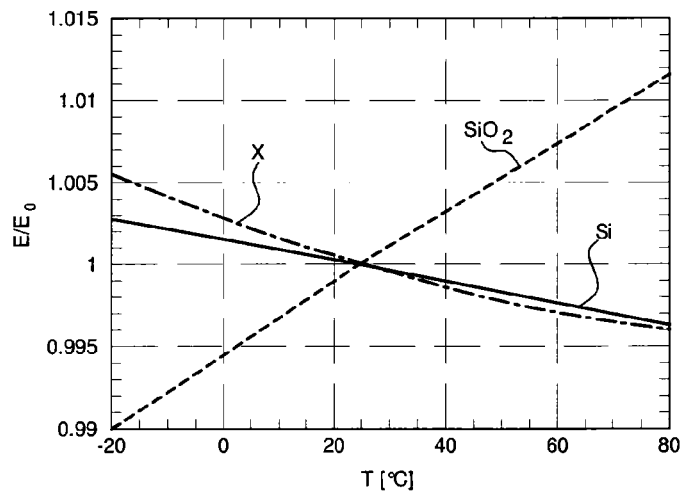
FIG. 5 is a graph showing the elastic modules of each material according to a second embodiment of the invention.

By way of example, it is highly likely that a material which will be called X (like stabilised zirconium or hafnium oxides), which have negative first order (as is the case of most materials) and positive second order coefficients of thermal elasticity, can achieve thermal compensation. This example is illustrated in FIG. 5. It is therefore clear that, for this type of material, the first coating must have a greater thickness than that of the embodiment of FIG. 4.

The invention claimed is:

1. A temperature compensated resonator including a body used in deformation, the core of the body including a first material, wherein the body has at least a first and second coating respectively made of second and third materials, the variations of Young's modulus with temperature being different for each material, each thickness of said at least first and second coatings being adjusted to allow said resonator to have substantially zero first and second order frequency variations with temperature, wherein the body further includes a third coating made of a fourth material whose variations of Young's modulus with temperature are different from the materials of the core and the first and second coatings, each thickness of the first, second, and third coatings being adjusted to allow the resonator to have substantially zero first, second, and third order frequency variations with temperature.

2. A temperature compensated resonator including a body used in deformation, the core of the body including a first material, wherein the body has at least a first and second coating respectively made of second and third materials, the variations of Young's modulus with temperature being different for each material, each thickness of said at least first and second coatings being adjusted to allow said resonator to have substantially zero first and second order frequency variations with temperature, wherein the core of the body has negative first and second order variations of Young's modulus with temperature.

3. The resonator according to claim 2, wherein the core of the body includes single crystal silicon.

4. A temperature compensated resonator including a body used in deformation, the core of the body including a first material, wherein the body has at least a first and second coating respectively made of second and third materials, the variations of Young's modulus with temperature being different for each material, each thickness of said at least first and second coatings being adjusted to allow said resonator to have substantially zero first and second order frequency variations with temperature, wherein the body has a substantially quadrilateral-shaped section with pairs of identical faces.

5. The resonator according to claim 4, wherein the body includes at least two symmetrically mounted bars to form a tuning fork.

6. A temperature compensated resonator including a body used in deformation, the core of the body including a first material, wherein the body has at least a first and second coating respectively made of second and third materials, the variations of Young's modulus with temperature being different for each material, each thickness of said at least first and second coatings being adjusted to allow said resonator to have substantially zero first and second order frequency variations with temperature, wherein the body includes a substantially quadrilateral-shaped section whose faces are entirely coated.

7. The resonator according to claim 6, wherein the body includes at least two symmetrically mounted bars to form a tuning fork.

8. A temperature compensated resonator including a body used in deformation, the core of the body including a first material, wherein the body has at least a first and second coating respectively made of second and third materials, the variations of young's modulus with temperature being different for each material, each thickness of said at least first and second coatings being adjusted to allow said resonator to have substantially zero first and second order frequency variations with temperature, wherein first coating has positive first order and negative second order variations of Young's modulus with temperature.

9. The resonator according to claim 8, wherein the first coating includes silicon dioxide.

10. The resonator according to claim 8, wherein the second coating has a positive second order variation of Young's modulus with temperature.

11. The resonator according claim 10, wherein the second coating has a positive first order variation of Young's modulus with temperature.

12. The resonator according to claim 11, wherein the second coating includes germanium dioxide.

13. The resonator according to claim 10, wherein the second coating has a negative first order variation of Young's modulus with temperature.

14. The resonator according to claim 10, wherein the first coating is inverted with the second coating.

15. A temperature compensated resonator including a body used in deformation, the core of the body including a first material, wherein the body has at least a first and second coating respectively made of second and third materials, the variations of Young's modulus with temperature being different for each material, each thickness of said at least first and second coatings being adjusted to allow said resonator to have substantially zero first and second order frequency variations with temperature, wherein the body is a bar wound around itself to form a balance spring and is coupled to an inertia fly wheel.

16. A timepiece comprising at least one resonator according to claim 15.

* * * * *